(12) United States Patent
Sakai (10) Patent No.: US 8,071,894 B2
(45) Date of Patent: Dec. 6, 2011

(54) SEMICONDUCTOR DEVICE HAVING A MOUNT BOARD

(75) Inventor: Yuji Sakai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 794 days.

(21) Appl. No.: 11/984,176

(22) Filed: Nov. 14, 2007

(65) Prior Publication Data

US 2008/0073116 A1    Mar. 27, 2008

Related U.S. Application Data

(62) Division of application No. 11/349,200, filed on Feb. 8, 2006, now Pat. No. 7,307,224.

(30) Foreign Application Priority Data

Feb. 9, 2005 (JP) ................................. 2005-033011

(51) Int. Cl.
    *H05K 5/00* (2006.01)
(52) U.S. Cl. ........ 174/520; 174/252; 174/250; 257/701; 257/722; 257/713; 257/685; 257/712
(58) Field of Classification Search .................. 174/520, 174/252, 250; 257/701, 722, 713, 685, 712
    See application file for complete search history.

(56) References Cited

U.S. PATENT DOCUMENTS

| | | | |
|---|---|---|---|
| 5,940,277 A | 8/1999 | Farnworth et al. | |
| 6,088,238 A | 7/2000 | Farnworth et al. | |
| 6,144,560 A | 11/2000 | Farnworth et al. | |
| 6,265,773 B1 | 7/2001 | Kinsman et al. | |
| 6,295,209 B1 | 9/2001 | Farnworth et al. | |
| 6,437,435 B1 | 8/2002 | Kinsman et al. | |
| 6,531,764 B2 | 3/2003 | Kinsman et al. | |
| 6,775,139 B2 | 8/2004 | Hsueh | |
| 7,106,595 B2 | 9/2006 | Foster, Sr. et al. | |
| 7,307,224 B2 * | 12/2007 | Sakai ........................... | 174/520 |

FOREIGN PATENT DOCUMENTS

| | | |
|---|---|---|
| JP | 8-017533 | 1/1996 |
| JP | 10-302899 | 11/1998 |
| JP | 2001-118984 | 4/2001 |
| JP | 2003-17634 | 1/2003 |
| JP | 2004-79940 | 3/2004 |

OTHER PUBLICATIONS

Japanese Office Action dated Mar. 21, 2008 with Partial English Translation.

* cited by examiner

*Primary Examiner* — Junghwa M Im (74) *Attorney, Agent, or Firm* — McGinn IP Law Group, PLLC (57) ABSTRACT

A semiconductor device includes a module board mounting thereon an electric component and including a plug at an edge of the module board, and a mount board including thereon a socket adapted to said plug on a surface portion of the mount board for mounting thereon the module board via said plug, wherein the mount board includes therein a heat radiation layer in contact with a bottom surface of the socket, wherein the socket comprises a heat radiation guide plate in contact with a side surface of the socket.

23 Claims, 9 Drawing Sheets

SEMICONDUCTOR DEVICE HAVING A MOUNT BOARD

The present Application is a Divisional Application of U.S. patent application Ser. No. 11/349,200, filed on Feb. 8, 2006 now U.S. Pat. No. 7,307,224.

BACKGROUND OF THE INVENTION

1. Field of the Invention

The present invention relates to a semiconductor device having a mount board in which a module board provided with one or a plurality of electronic components is mounted on a socket and, more particularly, to a technique of cooling the module board mounted on the mount board.

2. Description of the Related Art

In electronic devices such as a personal computer or a server, a conventional memory device such as a DRAM (Dynamic Random Access Memory) device is directly mounted on a motherboard (mount board). However, in up-to-date memory devices, a memory module board on which one or a plurality of memory devices are mounted on a printed circuit board is prepared separately from a mount board, and is mounted on the mount board by a socket provided on the surface of the mount board.

In a memory module board, the amount of heat generated in the memory devices increases in accordance with the development of a higher density of memory devices mounted and increase in the read/write speed thereof.

The increase in the amount of heat generated in a memory device has involved an excessive temperature rise in the memory module board. This causes a problem of operation errors and system down in the electronic devices.

To prevent operation errors and system down in the electronic devices and to ensure excellent operation characteristics of the electronic devices, temperature of the memory module board has to be prevented from excessively rising by efficiently diffusing the heat generated in the memory module board, to thereby suppress occurring of a thermal runway. Patent Publications JP-A-2004-079940 (FIG. 2), JP-A-2003-017634 (FIG. 1), and JP-A-2001-118984 (FIG. 1) describe that various heat radiation members are provided on the side surfaces of a memory module board, on which memory devices are provided, to radiate heat from the side surfaces of the memory module board, thereby suppressing the temperature rise thereof.

In the memory module boards used in recent years, the higher density and higher processing speed of the memory devices have considerably increased the mount of heat generated therein. Therefore, it is difficult to sufficiently suppress the temperature rise of the memory module board simply by radiating the heat from the side surfaces of the memory module board, and to ensure superior operating characteristics of electronic devices.

SUMMARY OF THE INVENTION

In view of the above situation, it is an object of the present invention to effectively suppress the temperature rise of a module board in a semiconductor device having a mount board on which the module board provided with electronic components such as memory devices is mounted on a socket, to ensure excellent operating characteristics of an electronic device including the semiconductor device.

The present invention provides, in a first aspect thereof, a semiconductor device including: a module board mounting thereon an electric component and having a plug at an edge of the module board; and a mount board having thereon a socket adapted to the plug on a surface portion of the mount board, for mounting thereon the module board via the plug, wherein the socket includes a heat radiation guide plate in contact with a side surface of the socket.

The present invention provides, in a second aspect thereof, a semiconductor device including: a module board mounting thereon an electric component and having a plug at an edge of the module board; and a mount board having thereon a socket adapted to the plug on a surface portion of the mount board for mounting thereon the module board via the plug, wherein the surface portion of the mount board has a thermal conductivity of 1 watt/meter·K or above.

According to the semiconductor device of the first aspect of the present invention, most of heat generated from the module board is radiated from the socket through the heat radiation guide plate in addition to conventional heat radiation paths, when the semiconductor device is supplied with electric power and the module board is operating. Therefore, in comparison with the conventional semiconductor devices, the heat generated in the module board is efficiently radiated therefrom, and temperature rise of the module board can be effectively suppressed.

According to the semiconductor device of the second aspect of the present invention, heat transferred to the surface portion of the mount board that the socket contacts quickly spreads in the in-plane directions of the mount board and is radiated to the mount board having a large heat capacity, when the semiconductor device is supplied with electric power and the module board is operating. This is because the surface portion of the mount board has a high thermal conductivity. Therefore, in comparison with the conventional semiconductor devices, the heat generated in the module board is efficiently radiated therefrom, and temperature rise of the module board can be effectively suppressed.

The present invention can be applied to a semiconductor device in which the electronic component is a memory device. Thermal runaway caused by an excessive tem rise in the memory device can thereby be prevented. In the present invention, the heat radiation guide plates or the surface portion, on which the memory module is mounted, preferably have a thermal conductivity of 50 W/m·K or higher. For example, iron, aluminum, copper or PGS can be used as the material having the thermal conductivity of 50 W/m·K or higher.

DETAILED DESCRIPTION OF THE PREFERRED EMBODIMENTS

Before describing the preferred embodiment of the present invention, the gist of the present invention will be described for a better understanding of the present invention.

The present inventor carried out a simulation, in which the thermal conduction paths are examined in a memory module board by thermal analysis, in order to find the structure for suppressing the temperature rise of a memory module board. As a result of the simulation, the following was found. The heat generated in the memory module board was radiated from the surface of the memory module board to the ambient air and simultaneously radiated through a socket toward the mount board. The amount of heat reached to the mount board was equal to about 45% of the whole heat radiation. Based on the result of this simulation, the present inventor derived an idea that the temperature rise of the memory module board can be effectively suppressed by efficiently radiating the heat toward the mount board from the memory module board.

The present inventor further discussed specifically the structure to efficiently radiate the heat from the memory module board to the mount board, and decided to provide a heat radiation guide plate which contacts each of the socket and the mount board. The memory module board is mounted on the socket via a plug. In this case, in addition to the conventional heat radiation paths, heat generated by the memory module board is transferred to the heat radiation guide plate from the combination of plug and socket, and further to the mount board therefrom. Thus, the heat is efficiently radiated from the memory module board. In addition, radiation of heat from the socket to the mount board was efficiently carried out by setting thermal conductivity of the heat radiation guide plate at higher than 1 W/m·K.

Furthermore, the surface portion of the mount board that the socket or heat radiation guide plate contacts is configured by a heat radiation layer having a thermal conductivity of 1 W/m·K or higher, in place of the conventional layer having a thermal conductivity of less than 1 W/m·K. In this case, the heat transferred to the mount board through the combination of plug and socket or the heat radiation guide plate spreads quickly in the in-plane directions of the mount board through the heat radiation layer, and is radiated to the mount board having a larger thermal capacity through the heat radiation layer. Thus, the heat generated in the memory module board can be efficiently radiated to the mount board.

Alternatively, a similar advantage can be obtained by providing a heat radiation sheet having a thermal conductivity of 1 W/m·K or higher on the mount board, which is kept in contact with the socket or heat radiation guide plate. In particular, the heat can be radiated more efficiently from the memory module if the heat radiation guide plate, heat radiation layer, or heat radiation sheet is made of iron, aluminum, copper or a material having a thermal conductivity of 50 W/m·K or higher, such as PGS.

Now, the present invention will be described below in more detail with reference to the accompanying drawings, based on the embodiments of the present invention.

Figure 1:
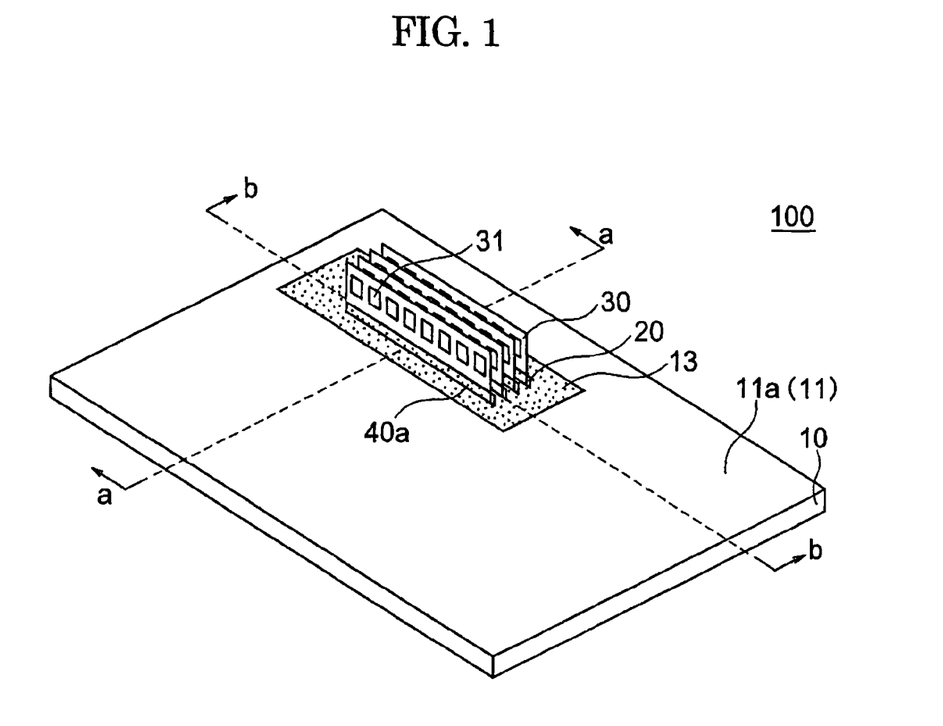
FIG. 1 is a perspective view showing the structure of a semiconductor device according to a first embodiment of the present invention.
Figure 2:
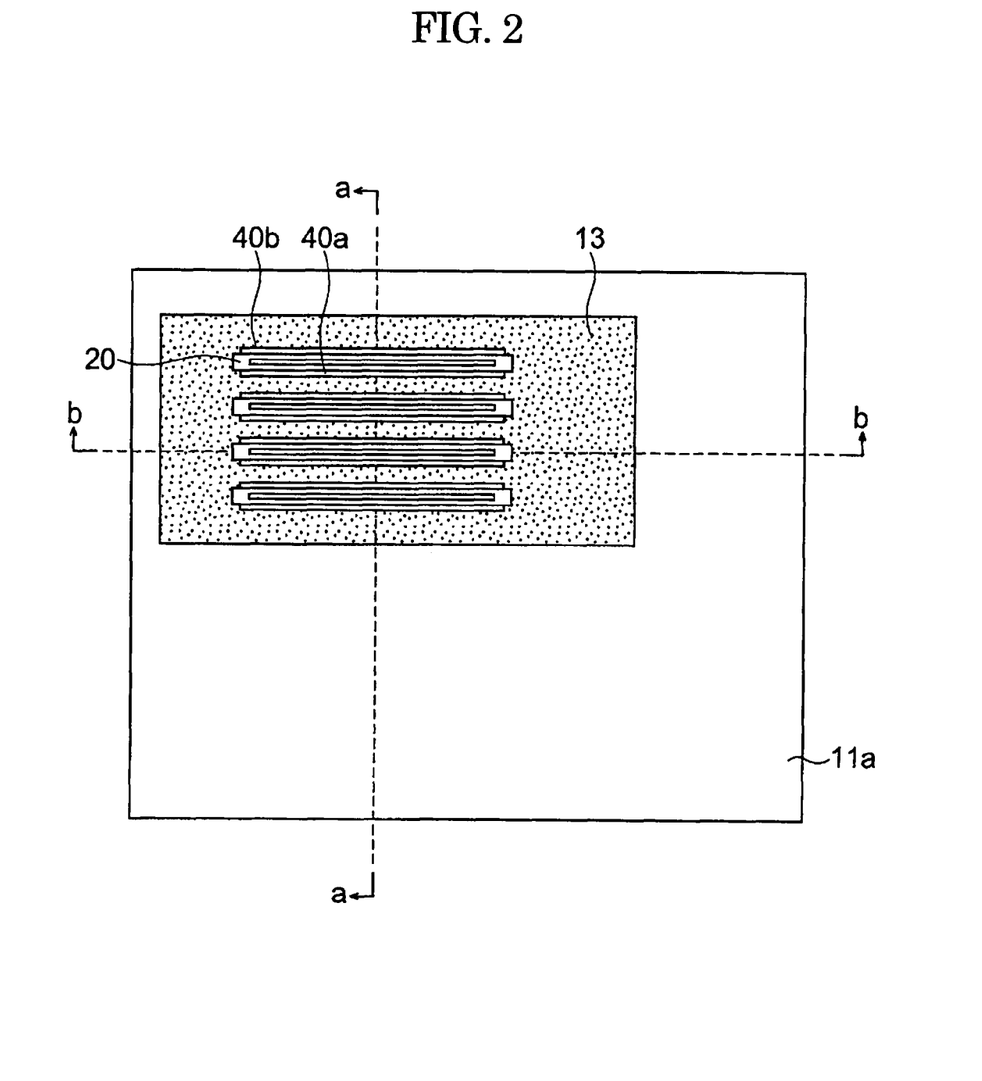
FIG. 2 is a top plan view showing the semiconductor device in FIG. 1 from which memory module boards are removed.

FIG. 1 is a perspective view showing the structure of a semiconductor device according to a first embodiment of the present invention. FIG. 2 is a top plan view showing the semiconductor device shown in FIG. 1, from which memory module boards are removed. The semiconductor device, generally designated by numeral 100, has a mount board 10, an elongate socket 20 provided on the mount board 10, and memory module boards 30 mounted on the socket 20.

The memory module board 30 is a card-like board having a rectangular shape. A plurality of memory devices 31 are provided on both surfaces of the memory module board 30, and an elongate plug is provided on an edge portion of the memory module board 30. The plug has a plurality of plug terminals arranged in a row on both sides of the memory module board 30 and near the edge of the memory module board 30. The socket 20 has a plurality of socket terminals arranged in two rows and each corresponding to one of the plug terminals of the plug.

The mount board 10 is configured as a multilayer printed circuit board, and has a structure in which a plurality of insulating layers 11 of FR4 (Flame Retardant Type 4) are layered one on another. The socket In an area underlying the socket 20 except for the center of the socket 20, a heat radiation layer 13 made of copper is formed in place of the uppermost insulating layer 11a. Copper heat radiation guide plates 40a and 40b are provided in contact with the surface of the heat radiation layer 13 and the side surfaces of the socket 20. FR4 and copper have a heat conductivity of about 0.3 W/m·K and 385 W/m·K, respectively.

Figure 3A:
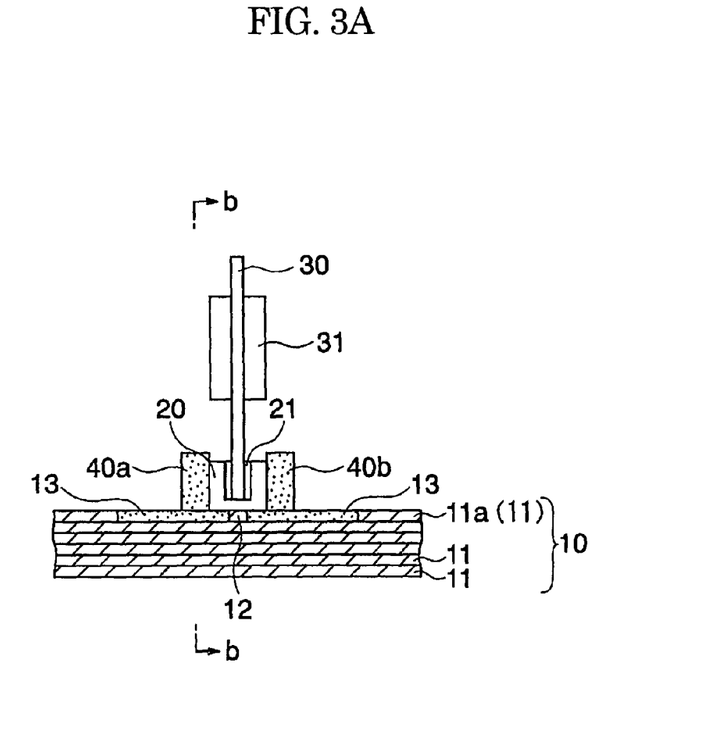
FIGS. 3A and 3B are sectional views taken along the lines a-a and b-b in FIG. 1.

FIG. 3A shows a part of a cross-section taken along the line a-a shown in FIG. 1. In the mount board 10, interconnection patterns made of copper are formed between adjacent two insulating layers 11 and on top and bottom surfaces of the mount board 10. A number of through-holes (not shown) each penetrating the mount board 10 and a number of via holes (not shown) each penetrating one or a plurality of insulating layers 11 are formed in the mount board 10. Interconnection plugs are formed inside these through-holes and via holes, thereby connecting together different interconnection layers.

In the uppermost insulating layer 11a, the area underlying the center of the socket 20 configures an interconnection area 12. In the interconnection area 12, a plurality of via holes each penetrating one or a plurality of insulating layers 11 including the uppermost insulating layer 11a are formed. A plurality of electrodes provided at the bottom of the socket 20 and extending from the respective socket terminals are connected to the interconnection plugs formed inside the via holes and through-holes.

The socket 20 has a U-shaped cross-section. A plurality of socket terminals 21 are provided on both inner side surfaces of the U-shaped socket 20. On the memory module board 30, a plurality of plug terminals (not shown) are formed on both side surfaces of the board at a lower portion thereof. These plug terminals are coupled to the socket terminals 21 of the socket by insertion of the plug into the socket 21. The heat radiation guide plates 40a and 40b have a height substantially equal to the height of the socket 20. A grease (not shown) is applied between side surfaces of the socket 20 and the heat radiation guide plates 40a and 40b, to tighten the contact between the side surfaces of the socket 20 and the heat radiation guide plates 40a and 40b. Thus, efficiency of thermal conduction between the socket 20 and the heat radiation guide plates 40a and 40b is improved.

Figure 3B:
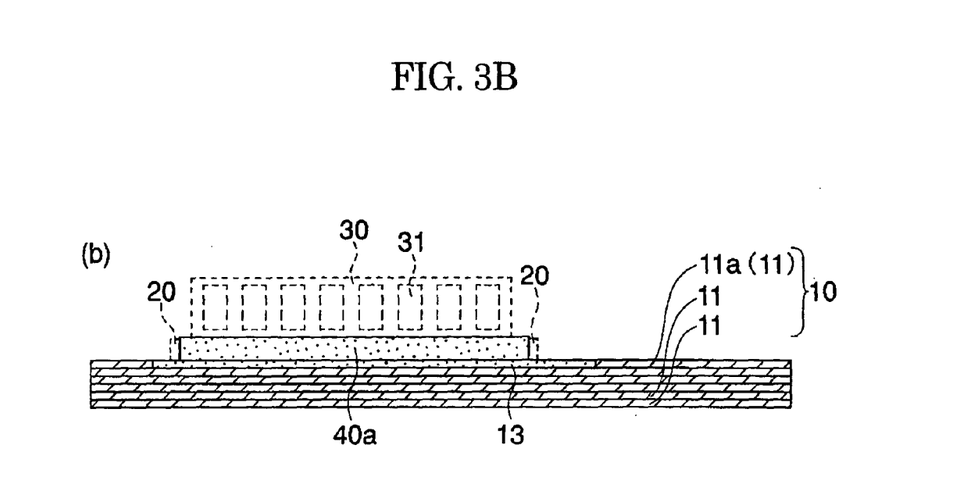

FIG. 3B shows a longitudinal-section taken along the direction b-b shown in FIG. 1 and FIG. 3A. The heat radiation guide plates 40a and 40b have substantially the same dimensions as the side surface of the socket 20 in the lengthwise direction and in the height direction. The heat radiation guide plates 40a and 40b are provided adjacent to the socket 20. The heat radiation layer 13 has such a planar shape that is large enough to encompass the whole bottom surface of the socket 20 and the heat radiation guide plates 40a and 40b, and yet does not obstruct connection of the mount board 10.

In manufacture of the semiconductor device 100, at first, the heat radiation layer 13 made of copper is formed around the interconnection area 12 prior to formation of the uppermost insulating layer 11a, during the process for forming the mount board 10. After forming the uppermost insulating layer 11a, the socket 20 is provided on the mount board 10. Thereafter, the heat radiation guide plates 40a and 40b each are formed so as to contact a side surface of the socket 20 and the upper surface of the heat radiation layer 13.

In operation of the semiconductor device 100, wherein electric power is supplied to the semiconductor device 100 to activate the memory module board 30, most of the heat generated in the memory module board 30 is transferred to the heat radiation guide plates 40a and 40b through the socket 20, in addition to the conventional heat radiation paths. The heat is then transferred to the heat radiation layer 13 from the heat radiation guide plates 40a and 40b. Alternatively, the heat is directly transferred to the heat radiation layer 13 from the socket 20. The heat transferred to the heat radiation layer 13 quickly spreads in the in-plane directions of the mount board 10, and is thus quickly radiated toward the mount board 10 having a larger thermal capacity. Accordingly, in comparison with the conventional semiconductor device, the heat is efficiently radiated from the memory module board 30, whereby temperature rise of the memory module board 30 can be effectively suppressed.

In the present embodiment, the heat radiation layer 13 is made of copper. However, the heat radiation layer 13 may be made of another material having a thermal conductivity of 1 W/m·K or higher. For example, the heat radiation layer 13 may preferably be made of a PGS (Pyrolytic Graphite Sheet). The PGS has a thermal conductivity of 600 to 800 W/m·K or so in the direction in which the crystal surface thereof extends, and a thermal conductivity of 15 W/m·K or so in the thickness direction of the crystal surface. Therefore, if the heat radiation layer 13 is made of PGS, the heat can be efficiently radiated by arranging the crystal surface of the PGS in parallel with the extending direction of the heat radiation layer 13.

In addition, in the present embodiment, the heat radiation guide plates 40a and 40b are made of copper. However, the heat radiation guide plates 40a and 40b may be made of another material. As a preferable example, the heat radiation guide plates 40a and 40b may be made of aluminum having a thermal conductivity of 201 W/m·K, iron having a thermal conductivity of 80 W/m·K. Further, the heat radiation layer 13 or heat radiation guide plates 40a and 40b may be made of insulating material having a high thermal conductivity. Examples of the insulating material having a high thermal conductivity include silicon nitride, aluminum nitride, and the like.

Figure 4A:
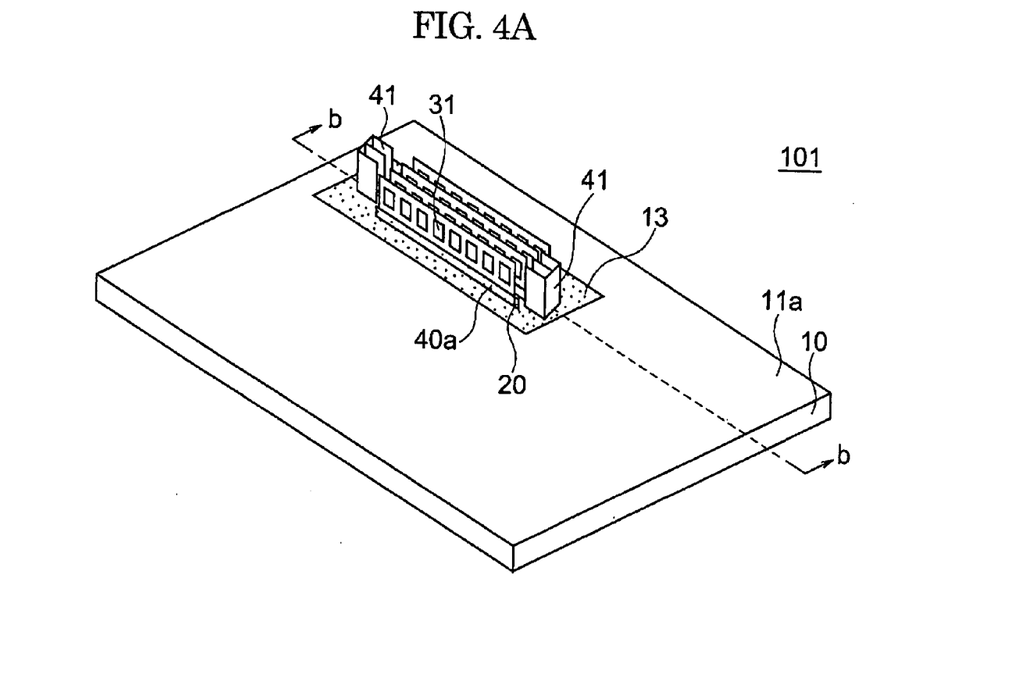
FIG. 4A is a perspective view showing the structure of a semiconductor device according to a first modification of the first embodiment.
Figure 4B:
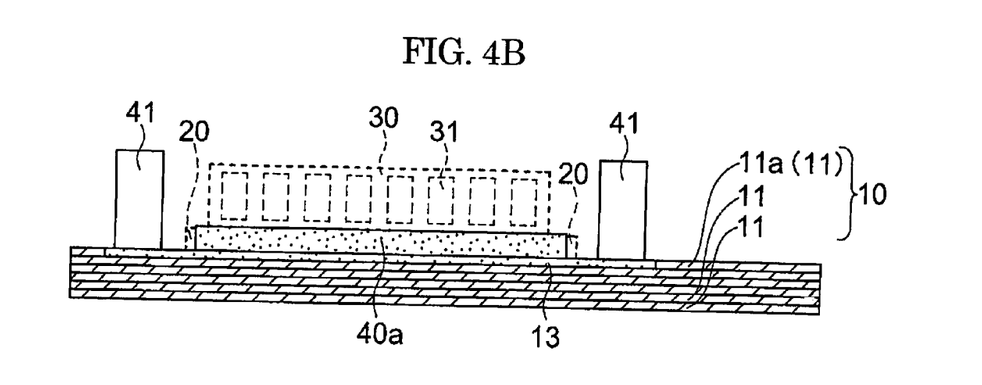
FIG. 4B is a sectional view taken along the line b-b in FIG. 4A.

FIG. 4A is a perspective view showing the structure of a semiconductor device according to a first modification of the first embodiment. FIG. 4B shows a longitudinal-section taken along the line b-b shown in FIG. 4A. In the semiconductor device 101, heat radiation fins 41 are provided on a line extending from the longitudinal direction of the socket 20 and on the surface of the heat radiation layer 13. That is, the heat radiation fins 41 are additionally provided in the structure of the semiconductor device 100 shown in FIG. 1. According to the semiconductor device 101 of the present modification, the heat radiation fins 41, provided on the heat radiation layer 13, assist radiation of the heat generated in the heat radiation layer 13 for the mount board 10 toward the ambient air. Accordingly, in comparison with the semiconductor device 100 shown in FIG. 1, the temperature rise of the memory module board 30 can be more effectively suppressed. A heat radiation fan may be additionally provided on the mount board 10.

Figure 5:
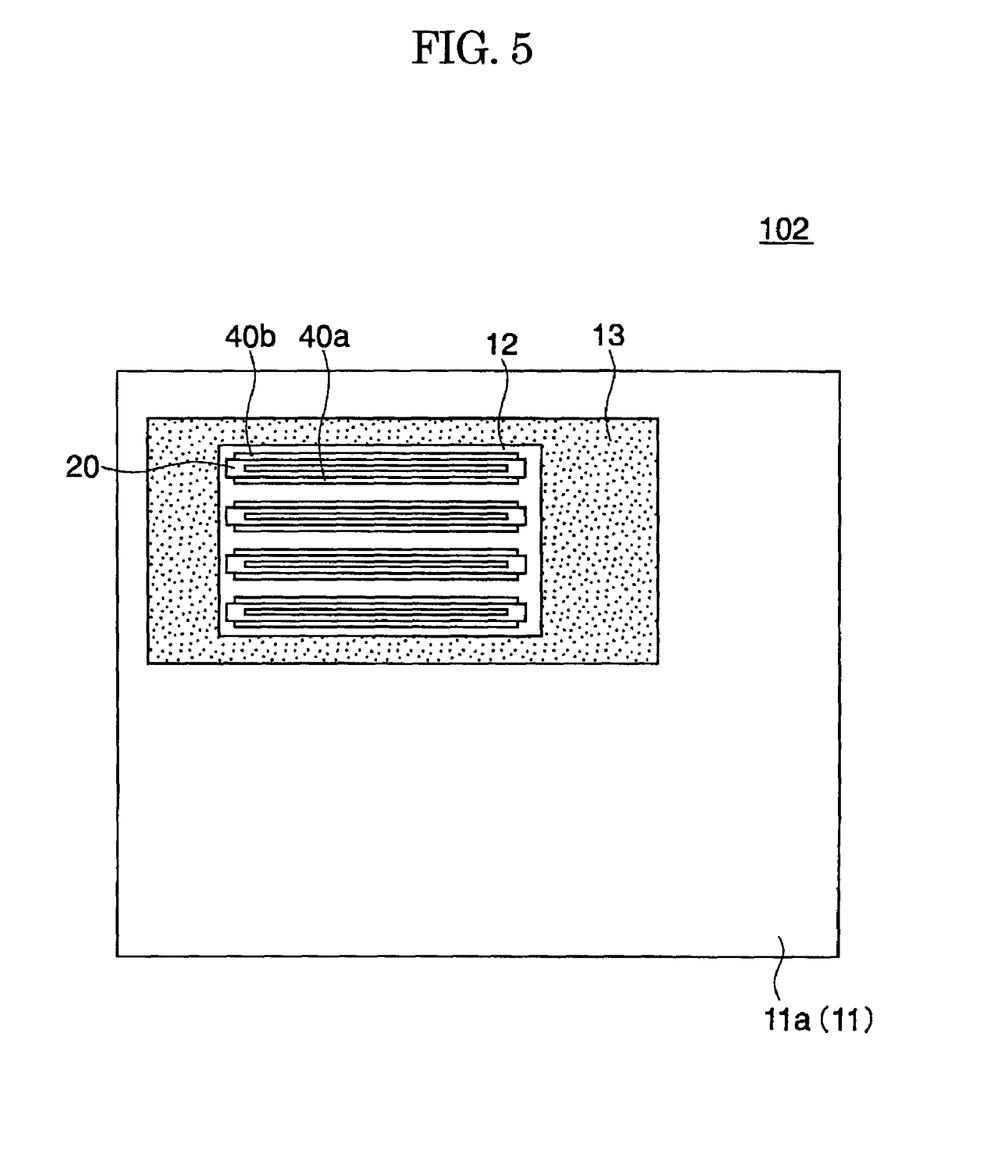
FIG. 5 is a top plan view showing the structure of a semiconductor device according to a second modification of the first embodiment.
Figure 6:
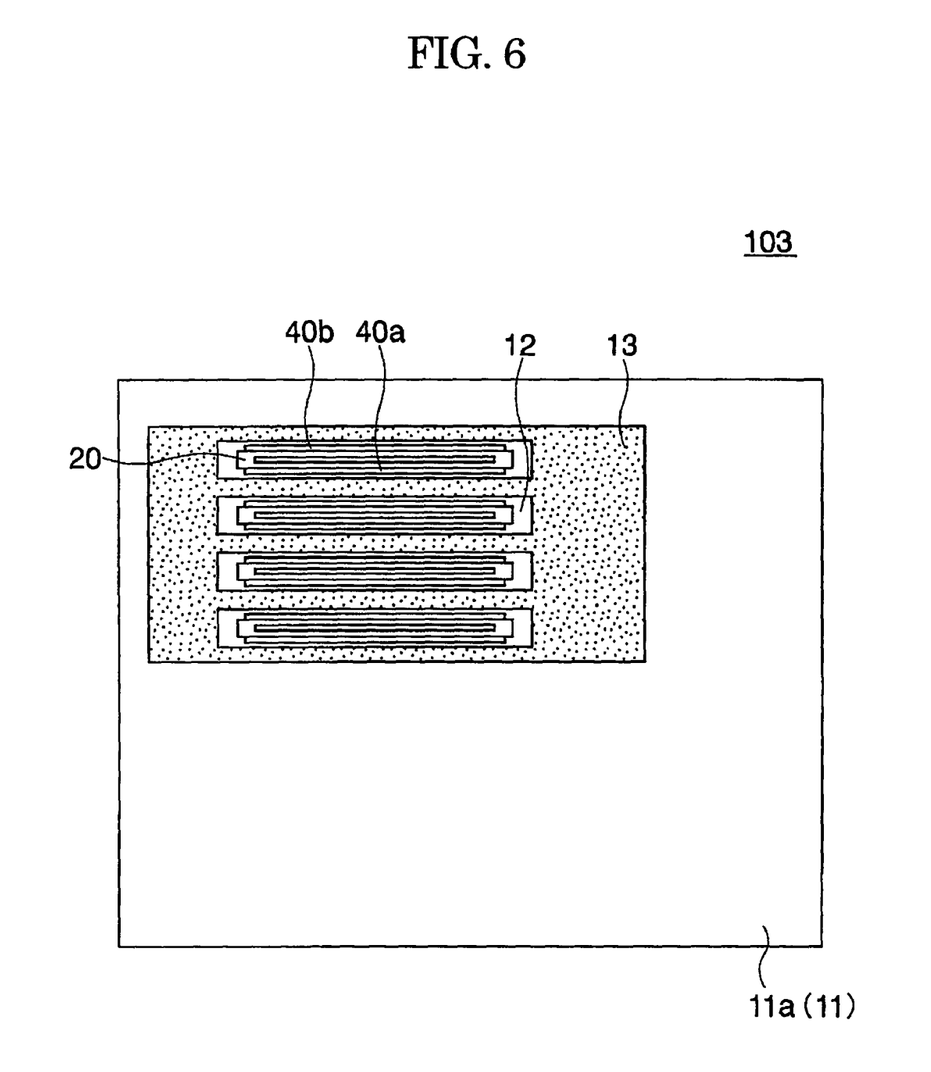
FIG. 6 is a top plan view showing the structure of a semiconductor device according to a third modification of the first embodiment.
Figure 7:
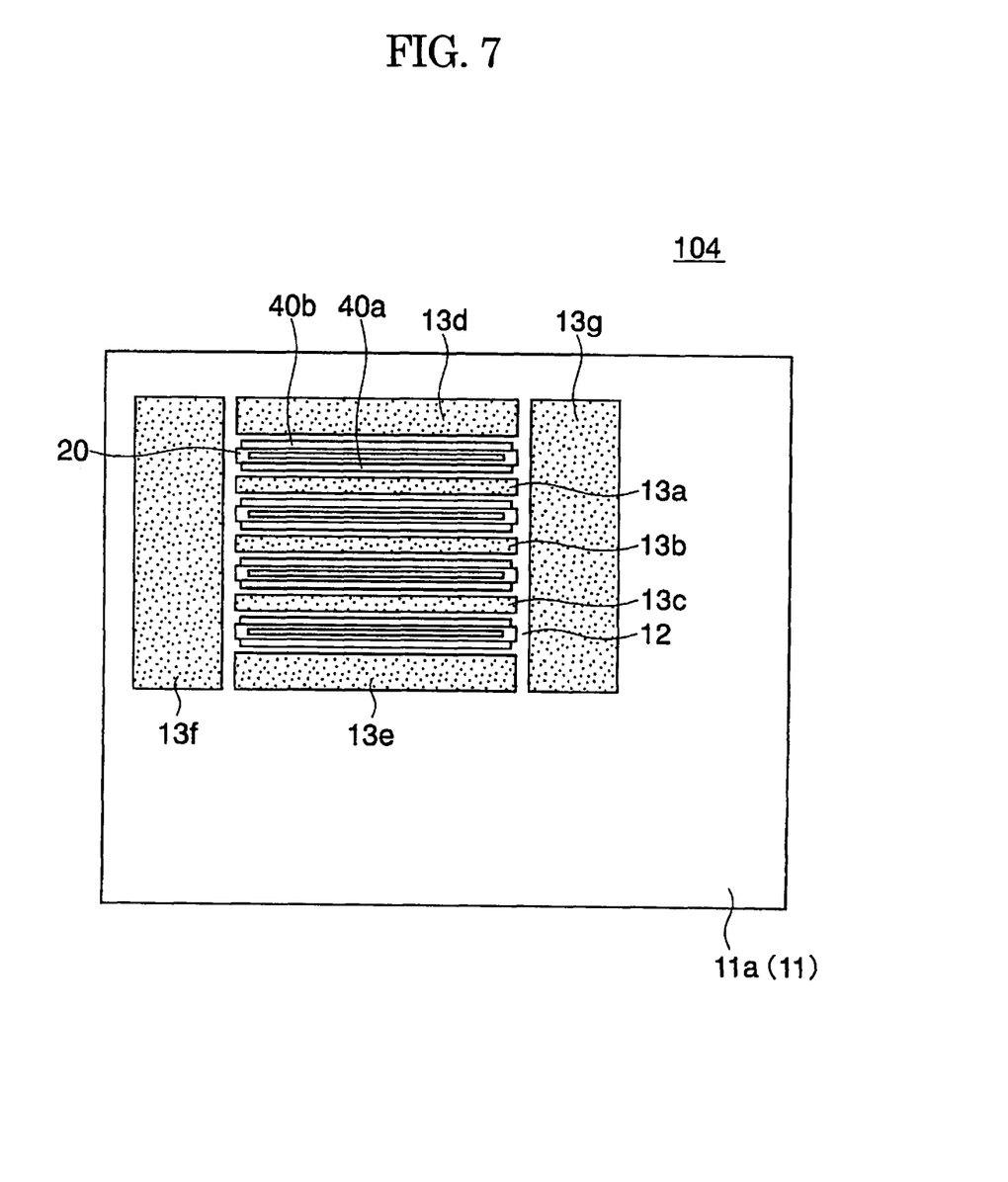
FIG. 7 is a top plan view showing the structure of a semiconductor device according to a fourth modification of the first embodiment.

It is to be noted that, if the heat radiation layer 13 in the semiconductor device 100 shown in FIG. 1 is made of a conductive material, interconnection patterns which contact the heat radiation layer 13 cannot be provided without involving a short-circuit failure. Therefore, the interconnection area 12 should have a broad area by providing the heat radiation layer 13 apart from the socket 20, if complicated interconnections are to be provided in the interconnection area 12. FIGS. 5 to 7 show semiconductor devices in which the heat radiation layer 13 is provided apart from the socket 20, according to second to fourth modifications of the first embodiment.

In the semiconductor device 102 shown in FIG. 5, the interconnection area 12 is provided to encompass the whole bottom surfaces of the socket 20 and the heat radiation guide plates 40a and 40b.

In the semiconductor device 103 shown in FIG. 6, a plurality of interconnection areas 12 are provided each to encompass the bottom surface of a corresponding socket 20 and a corresponding pair of heat radiation guide plates 40a and 40b. In the semiconductor device 104 shown in FIG. 7, first heat radiation layers 13a to 13c are provided each between adjacent two of the socket 20, second heat radiation layers 13d and 13e are respectively provided outside of the outermost socket 20, and third heat radiation layers 13f and 13g are provided in the vicinity of the edges of the socket 20 arranged therein. The interconnection areas 12 are provided in the space between the heat radiation layers 13a to 13g. This configuration provides a simpler structure for the interconnection circuit.

The heat radiation layers 13 having a high thermal conductivity and provided near the socket 20 in the semiconductor devices 102, 103, and 104 shown in FIGS. 5 to 7 effectively radiate the heat generated in the mount board 10 near the socket 20 in the in-plane directions of the mount board 10. Thus, the temperature rise of the memory module board 30 can be effectively suppressed.

Figure 8A:
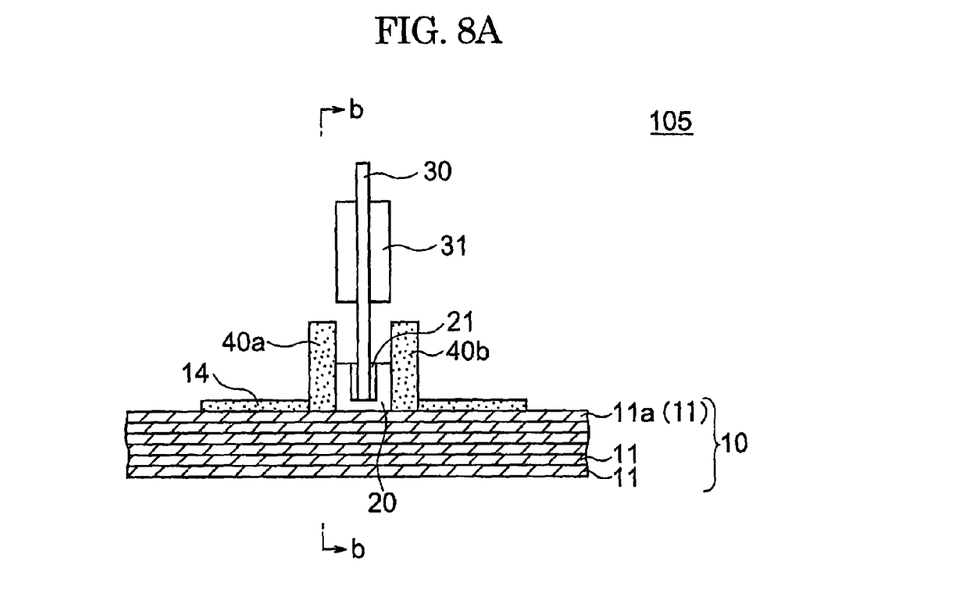
FIGS. 8A and 8B are sectional views showing a semiconductor device according to a second embodiment of the present invention, corresponding to FIGS. 3A and 3B.
Figure 8B:
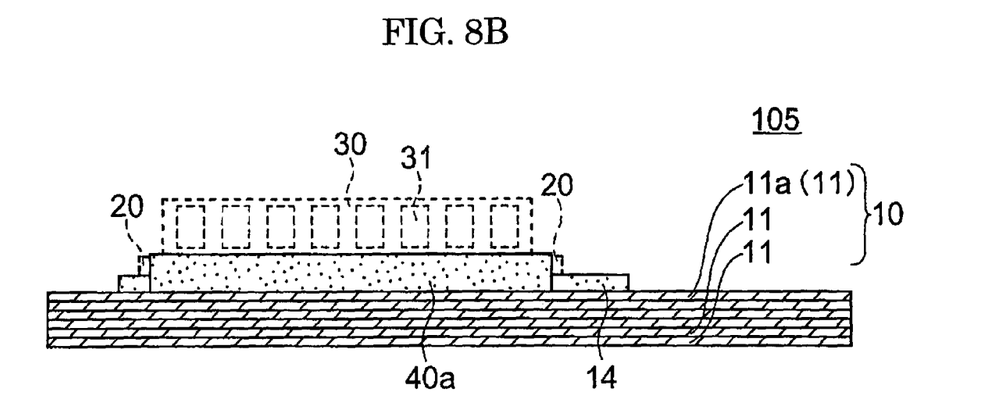

FIGS. 8A and 8B show a cross-section and a longitudinal section, respectively, of a semiconductor device according to a second embodiment of the present invention. FIG. 8A shows the structure of the memory module similarly to FIG. 3A, whereas FIG. 8B shows the structure of the memory module similarly to FIG. 3B. In the semiconductor device 105, the heat radiation layer 13 shown in FIG. 1 is not formed, and the uppermost insulating layer 11a is formed over the entire surface of the mount board 10. Heat radiation guide plates 40a and 40b are provided on the mount board 10, which is in contact with the side surfaces of a socket 20.

Heat radiation sheets 14 are provided on the mount board 10, which is in contact with the side surfaces of the heat radiation guide plates 40a and 40b. The semiconductor device 105 has a structure similar to the structure of the semiconductor device 100 shown in FIG. 1 except for the features described above.

According to the semiconductor device 105 of the present embodiment, the heat radiation sheets 14 can be formed easily on the mount board 10. Therefore, the semiconductor device 105 of the present embodiment can be more easily manufactured compared to the semiconductor device 100 of the first embodiment. In addition, the design choice of the circuit interconnections in the mount board 10 is increased since the heat radiation sheets 14 overlies an insulating layer 11a. The heat radiation sheets 14 may be provided in contact with the side surfaces of the socket 20, and heat radiation guide plates 40a and 40b may be provided on the heat radiation sheets 14.

Figure 9:
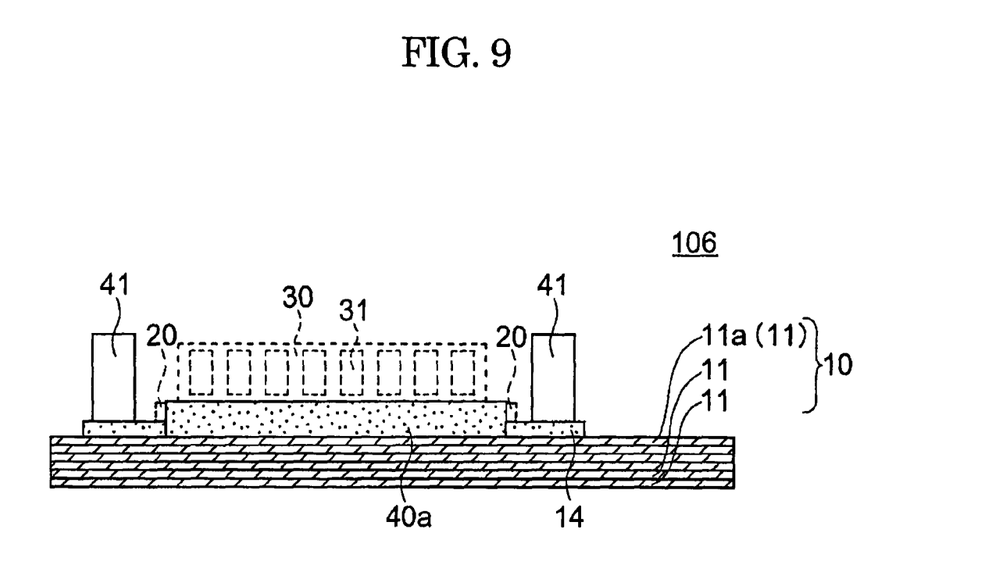
FIG. 9 is a sectional view showing the structure of a semiconductor device according to a modification example of the second embodiment.

FIG. 9 shows a longitudinal-section of the memory module board in a semiconductor device according to a modification of the second embodiment, similarly to FIG. 8B. The semiconductor device 106 of this modification corresponds to the structure of the semiconductor device 105 shown in FIG. 8 provided with heat radiation fins 41 on the surfaces of the heat radiation sheets 14. The heat radiation fins 41 are arranged on the line extended from the extending direction of the socket 20. By using the mount board 106 in the present modification, the heat is effectively radiated from of the heat radiation sheets 14 or mount board 10 toward the ambient air through the fins 41. Thus, in comparison with the semiconductor device 105 shown in FIG. 8, temperature rise of the memory module board 30 can be effectively suppressed. Additionally, a heat radiation fan may be provided on the mount board 10.

In the embodiments described above, memory module boards have been described. However, temperature rise of a variety of module boards each provided with one or a plurality of other electronic components can be effectively suppressed by applying a structure similar to those described above. In another electronic component directly mounted on a mount board other than the module boards, the temperature rise of the electronic component can be also effectively suppressed by forming a heat radiation layer as described above or by providing heat radiation guide plates and/or heat radiation sheets. In this case, the heat radiation guide plates are provided in contact with each of the electronic component and the mount board.

The present invention has been described above based on preferred embodiments thereof. However, the semiconductor devices according to the present invention are not limited to the structures described in the embodiments. The scope of the present invention should be considered as including those semiconductor devices that would be derived by making various changes and modifications to the structures of the above embodiments.

What is claimed is:

1. A semiconductor device comprising:
   a module board mounting thereon an electric component and including a plug at an edge of said module board; and
   a mount board including a socket which is adapted to said plug and formed on a surface portion of said mount board for mounting thereon said module board via said plug, said socket including a bottom surface in contact with the surface portion,
   wherein said surface portion of said mount board includes therein a heat radiation layer in contact with the bottom surface of said socket.

2. The semiconductor device according to claim 1, wherein said mount board comprises heat radiation fins fixed to said surface portion.

3. A semiconductor device comprising:
   a module board mounting thereon an electric component and including a plug at an edge of said module board; and
   a mount board including a socket which is adapted to said plug and formed on a surface portion of said mount board for mounting thereon said module board via said plug, said socket including a bottom surface in contact with the surface portion,
   wherein said surface portion of said mount board includes therein a heat radiation layer in contact with the bottom surface of said socket, wherein said heat radiation layer is other than an electric terminal of said module board.

4. The semiconductor device according to claim 3, wherein said heat radiation layer comprises copper.

5. The semiconductor device according to claim 3, wherein said socket comprises a heat radiation guide plate in contact with a side surface of said socket.

6. The semiconductor device according to claim 3, further comprising an interconnection area, wherein said heat radiation layer is disposed around said interconnection area.

7. The semiconductor device according to claim 3, further comprising an uppermost insulating layer, wherein said heat radiation layer replaces a portion of said uppermost insulating layer.

8. The semiconductor device according to claim 3, wherein said heat radiation layer includes a planar shape sufficient to encompass substantially an entire bottom surface of said socket.

9. The semiconductor device according to claim 3, wherein said electric component comprises a memory device.

10. A motherboard comprising:
    a module board mounting thereon an electric component and comprising a plug at an edge of said module board;
    a socket adapted to said plug and formed on a surface portion of said motherboard for mounting thereon said module board via said plug, said socket including a bottom surface in contact with the surface portion; and
    a heat radiation layer formed in said surface portion of said motherboard and in contact with the bottom surface of said socket, wherein said heat radiation layer is other than an electric terminal of said module board.

11. The motherboard according to claim 10, wherein said socket comprises a heat radiation guide plate in contact with a side surface of said socket.

12. The motherboard according to claim 10, wherein said electric component comprises a memory device.

13. The motherboard according to claim 11, wherein said electric component comprises a memory device.

14. The semiconductor device according to claim 1, wherein said socket comprises a heat radiation guide plate in contact with a side surface of said socket.

15. The semiconductor device according to claim 14, wherein said heat radiation guide plate has a thermal conductivity of 1 watt/meter K or above.

16. The semiconductor device according to claim 14, wherein said heat radiation guide plate is in contact with said surface portion of said mount board.

17. The semiconductor device according to claim 1, wherein said mount board comprises a mount for a cooling fan for cooling said heat radiation guide plate.

18. An apparatus comprising:
    a module board comprising an edge area, a center area, and a plurality of plug terminals provided in the edge area;
    at least one electronic device mounted on the center area and electrically connected to the plug terminals;
    a socket comprising a concave portion and a plurality of socket terminals provided on a surface of the concave portion, the module board being inserted into the concave portion such that the plug terminals are in contact with the socket terminals;

a mount board on which the socket is mounted; and a heat radiation layer partially embedded in the mount board such that a top surface of the heat radiation layer is substantially coplanar with a top surface of the mount board, the heat radiation layer being larger in heat conductivity than the mount board and intervening at least a part thereof between the mount board and the socket with an electrical isolation from each of the socket terminals of the socket.

19. The apparatus as claimed in claim 18, wherein the mount board includes a plurality of via holes that are electrically connected to the socket terminals of the socket, the heat radiation layer being configured to sandwich the via holes.

20. The apparatus as claimed in claim 18, wherein the socket further comprises a side surface, the apparatus further comprising a heat radiation guide plate directly connected with the side surface of the socket and the heat radiation layer.

21. The semiconductor device according to claim 1, wherein the mount board includes an insulating layer, the socket is formed over the insulating layer, and the heat radiation layer is formed between the socket and the insulating layer.

22. The semiconductor device according to claim 1, wherein the socket includes a top surface which is opposite the bottom surface, the top surface including an opening for inserting the plug of the module board.

23. The semiconductor device according to claim 1, further comprising a plurality of electrodes formed at a bottom of the socket, wherein the surface portion of the mount board further comprises an interconnection area which includes a plurality of interconnection plugs connected to the plurality of electrodes, and wherein the bottom surface of the socket is in contact with the interconnection area and the heat radiation layer is formed on a side of the interconnection area and in the same plane as the interconnection area.

* * * * *